United States Patent
Fan et al.

(10) Patent No.: US 11,876,567 B2
(45) Date of Patent: Jan. 16, 2024

(54) ELECTROMAGNETIC TOOL CALIBRATION FOR TILTED ANTENNAS WITH UNDETERMINED ORIENTATION ANGLES

(71) Applicant: Halliburton Energy Services, Inc., Houston, TX (US)

(72) Inventors: Yijing Fan, Singapore (SG); Hsu-Hsiang Wu, Sugarland, TX (US); Jin Ma, Houston, TX (US); Li Pan, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 191 days.

(21) Appl. No.: 17/584,220

(22) Filed: Jan. 25, 2022

(65) Prior Publication Data

US 2023/0239059 A1     Jul. 27, 2023

(51) Int. Cl.
*E21B 47/13* (2012.01)
*H04B 17/12* (2015.01)
*G01R 29/08* (2006.01)

(52) U.S. Cl.
CPC ............. *H04B 17/12* (2015.01); *E21B 47/13* (2020.05); *G01R 29/0807* (2013.01)

(58) Field of Classification Search
CPC ......... E21B 47/13; E21B 49/00; G01V 13/00; G01V 3/08; G01V 3/38; G01V 3/18–34
See application file for complete search history.

(56) References Cited

U.S. PATENT DOCUMENTS

| | | | |
|---|---|---|---|
| 10,295,697 B2 * | 5/2019 | Wu | G01V 3/38 |
| 10,788,601 B2 | 9/2020 | Wu et al. | |
| 2013/0043884 A1 | 2/2013 | Le et al. | |
| 2015/0322774 A1 | 11/2015 | Wu et al. | |
| 2017/0261636 A1 | 9/2017 | Morris et al. | |
| 2019/0137646 A1 | 5/2019 | Frey | |
| 2020/0309984 A1 * | 10/2020 | Pan | G01V 3/28 |
| 2020/0408950 A1 | 12/2020 | Pan et al. | |

FOREIGN PATENT DOCUMENTS

WO     2011129828 A1     10/2011

OTHER PUBLICATIONS

PCT Application No. PCT/US2022/070354, International Search Report and Written Opinion, dated Oct. 7, 2022, 9 pages.

* cited by examiner

*Primary Examiner* — Hasan Islam

(74) *Attorney, Agent, or Firm* — DeLizio, Peacock, Lewin & Guerra, LLP

(57) ABSTRACT

A method includes detecting, via first and second receivers of a tool that are oriented at a first and a third tilt angle, respectively, a first and second measurement of a first signal transmitted by a transmitter of the tool that is oriented at a second tilt angle into a substantially non-conductive material. The method includes determining, based on the first and second measurements, a first tensor and conveying the tool into a first wellbore formed in a subsurface formation. The method includes detecting, via the first receiver and the second receiver, a third and fourth measurement, respectively, of a second signal transmitted by the transmitter and determining, based on the third and fourth measurements, a second tensor and determining a third tensor (having values independent of the first, second, and third tilt angles) based on a relationship between the first and second tensors.

20 Claims, 10 Drawing Sheets

ELECTROMAGNETIC TOOL CALIBRATION FOR TILTED ANTENNAS WITH UNDETERMINED ORIENTATION ANGLES

TECHNICAL FIELD

The disclosure generally relates to wellbore logging and, more specifically, to a wellbore logging with an electromagnetic tool having tilted antennas.

BACKGROUND

Different downhole tools can be used for formation evaluation, geosteering, etc. as part of downhole operations. For example, some downhole tools can include electromagnetic (EM) antennas. Such antennas can be tilted to provide for increased azimuthal sensitivity and eases of implementation in the mechanical design, especially for the 45 degree tilt antenna.

BRIEF DESCRIPTION OF THE DRAWINGS

Embodiments of the disclosure may be better understood by referencing the accompanying drawings.

DESCRIPTION OF EMBODIMENTS

The description that follows includes example systems, methods, techniques, and program flows that embody embodiments of the disclosure. However, it is understood that this disclosure may be practiced without these specific details. For instance, this disclosure refers to antennas at certain tilt angles in illustrative examples. Embodiments of this disclosure can be applied to antennas at other tilt angles. In other instances, well-known instruction instances, protocols, structures and techniques have not been shown in detail in order not to obfuscate the description.

Example embodiments relate to wellbore logging in a wellbore formed in a subsurface formation. Some embodiments can be used in various downhole applications (such as formation evaluation, geosteering, etc. Example embodiments address the sensitivity of a multi-component tensor to a tilt angle of an antenna of a downhole tool using for wellbore logging.

Example embodiments can decouple multi-component tensor without knowledge or independent of the antenna tilt angle. As further described below, such embodiments can save time and effort in determining the tilt angle in labs at the surface (using a mapping table) and simulation. The decoupled multi-components can be accurate for different antenna tilt angles. Accordingly, example embodiments provide for less restriction in antenna design. For example, the antenna orientation is not limited to a 45 degree angle.

Example Logging Tool

Figure 1A:
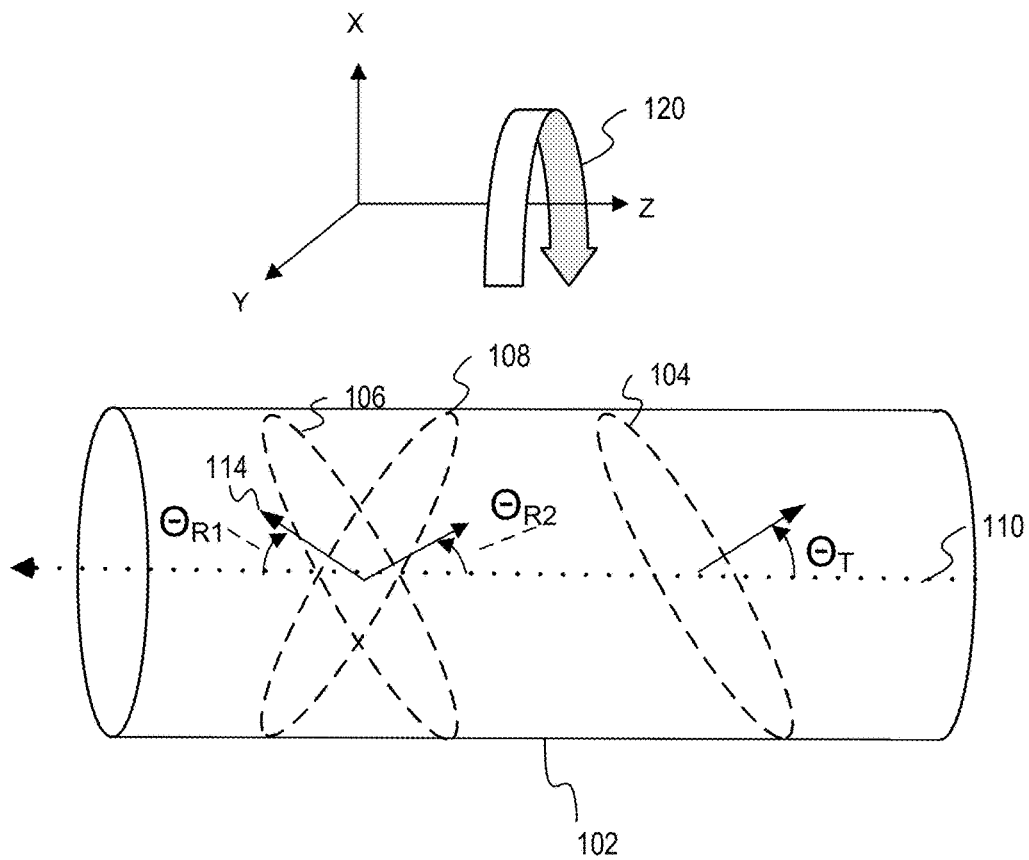
FIGS. 1A-B depicts example configurations of an example logging tool, according to some embodiments.
Figure 1B:
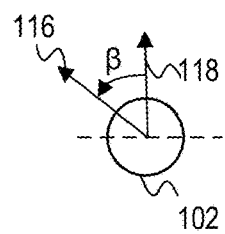

FIGS. 1A-B depict example configurations of an example logging tool, according to some embodiments. The logging tool 102 may be deployed in a wellbore to obtain information about a geological formation (hereinafter "formation"), to inform operations related to geosteering, or to perform other operations. As shown, the logging tool 102 may include a transmitter antenna 104 (also referred to herein as a "transmitter"), a first receiver antenna 106 (also referred to herein as "first receiver"), and a second receiver antenna 108 (also referred to herein as "second receiver"). The transmitter antenna 104, first receiver antenna 106, and second receiver antenna 108 each may be disposed at a respective tilt-angle θ. In FIG. 1A, the first receiver antenna 106 may have a tilt-angle $θ_{r1}$, where $θ_{r1}$ is an angle between a longitudinal axis 110 of the logging tool 102 and a normal vector 114 of a plane of the first receiver antenna 106. Similarly, $θ_{r2}$ describes a tilt-angle of the second receiver antenna 108. $θ_t$ describes a tilt-angle of the transmitter antenna 104. As noted, the logging tool 102 may azimuthally rotate 120 about the longitudinal axis 110. β may be an angle of a tool face relative to a high-side of the logging tool 102. As shown in FIG. 1B, β may be the angle between a normal vector of the high-side 118 and a normal vector of the tool face 116. As the logging tool 102 rotates, the transmitter antenna 104, first receiver antenna 106, and second receiver antenna 108 may have respective orientations relative to the high-side of the logging tool 102. Hence, β may vary with tool rotation and may be sampled into any suitable angle.

When in a borehole, the transmitter antenna 104 may transmit signals into a formation (not shown) and the first receiver antenna 106 and second receiver antenna 108 may receive those signals through the formation. The logging tool 102 may process the signals to determine properties about the formation, to inform geosteering operations, to create input for a three-dimensional (3D) inversion process, or as part of other operations. Traditionally, for the signal information to be useful, tilt-angles of the first and second receiver antennas 106 and 108 must be known before the logging tool 102 is deployed in a borehole. For example, tilt-angles of the first and second receiver antennas 106 and 108 must be known in order to convert raw measurements from the first and second receiver antennas 106 and 108 into a multi-component tensor which may be used as input to a 3D inversion process. This disclosure presents novel processes and components that may utilize such signal information without knowing the tilt-angles before deploying the logging tool 102 in a borehole. Hence, operators may avoid complicated processes for determining antenna tilt-angles before the logging tool 102 is deployed.

In some implementations, operators may cause the logging tool 102 to perform a series of operations to enable it to utilize signal information without a priori knowledge of the antenna tilt-angles. For example, the transmitter antenna

104 may transmit signals through the air (or through any substantially non-conductive material), where the logging tool 102 is oriented at known arbitrary azimuthal positions. The first and second receiver antennas 106 and 108 may measure the signals and determine a first tensor representing a magnetic field created by the antennas 104, 106, and 108. The first tensor may depend in-part on the tilt-angles of the first receiver antenna 106 and the second receiver antenna 108 (i.e., $\theta_{r1}$ and $\theta_{r2}$). The logging tool 102 may similarly measure signals in a borehole. For example, as the logging tool 102 azimuthally rotates in the borehole, the first and second receiver antennas 106 and 108 may measure signals transmitted through a formation by the transmitter antenna 104. The measurements may occur at various azimuthal positions. Based on the measurements, the logging tool 102 may determine a second tensor representing a magnetic field of the antennas 104, 106, and 108 in the borehole. The logging tool 102 may determine the second tensor based in-part on the tilt-angles of the first and second receiver antennas 106 and 108 (i.e., based on $\theta_{r1}$ and $\theta_{r2}$).

After creating the first and second tensors, the logging tool 102 may perform an air-hang calibration that will eliminate any need for a priori knowledge of the tilt-angles of the first and second receiver antennas 106 and 108. For the air-hang calibration, the logging tool 102 may be outside a borehole, such as suspended above ground. Using relationships represented in the first and second tensors, the logging tool 102 may determine a third tensor that is independent of the tilt-angles (i.e., $\theta_{r1}$ and $\theta_{r2}$). The third tensor may serve as input to a 3D inversion process. After performing the air-hang calibration, the logging tool 102 need not have a priori knowledge of the tilt-angles and of the first receiving antenna 106 ($\theta_{r1}$) and the second receiving antenna 108 ($\theta_{r2}$). Hence, the logging tool 102 may utilize signal measurements in a 3D inversion process without prior knowledge of the tilt-angles.

The logging tool 102 may perform operations that enable it to utilize signal information independent of the tilt-angle of the first receiving antenna 106 ($\theta_{r1}$) and the tilt-angle of the second receiver antenna 108 ($\theta_{r2}$). In some implementations, the following equations represent a tool response of the logging tool 102. Assuming a one-dimensional, stratified formation, a tool response of the logging tool 102 may be expressed using Equations 1 and 2, below:

$$Z_{TR1}(\beta) = \begin{bmatrix} \sin\theta_t \cos\beta \\ \sin\theta_t \sin\beta \\ \cos\theta_t \end{bmatrix}^T \begin{bmatrix} Z_{xx} & 0 & Z_{zx} \\ 0 & Z_{yy} & 0 \\ Z_{xz} & 0 & Z_{zz} \end{bmatrix} \begin{bmatrix} \sin\theta_r \cos(\beta+\beta_{TR1}) \\ \sin\theta_r \cos(\beta+\beta_{TR1}) \\ \cos\theta_r \end{bmatrix} \quad (1)$$

$$Z_{TR2}(\beta) = \begin{bmatrix} \sin\theta_t \cos\beta \\ \sin\theta_t \sin\beta \\ \cos\theta_t \end{bmatrix} T \begin{bmatrix} Z_{xx} & 0 & Z_{zx} \\ 0 & Z_{yy} & 0 \\ Z_{xz} & 0 & Z_{zz} \end{bmatrix} \begin{bmatrix} \sin\theta_r \cos(\beta+\beta_{TR2}) \\ \sin\theta_r \cos(\beta+\beta_{TR2}) \\ \cos\theta_r \end{bmatrix} \quad (2)$$

where TR1 indicates the transmitter and receiver pair of the transmitter antenna 104 and the first receiver antenna 106, and where TR2 indicates the transmitter and receiver pair of the transmitter antenna 104 and the second receiver antenna 108. As noted, $\beta$ is the tool face angle relative to the high side of the tool and measures rotation of the tool about the longitudinal axis 110. $\theta_t$ is an angle by which the transmitter is tilted with respect to the tool, and $\theta_r$ is the angle by which the receivers are tilted with respect to the tool. Z is a multi-component tensor representing the cross-component response factors $Z_{ij}$ (where i=x, y, z and j=x, y, z) and dependent on the transmitter angle $\theta_t$, the receiver angle $\theta_r$, and the tool face angle $\beta$. $\beta_{TR1}$ is the tool face angle difference between the transmitter antenna 104 and the first receiver antenna 106 and $\beta_{TR2}$ is the tool face angle difference between the transmitter antenna 104 and the second receiver antenna 108. In some implementations, $\beta_{TR1}$ may represent tool face angle differences between the transmitter antenna 104 and a plurality of receiver antennas including the first receiver antenna 106 (this concept also applies to $\beta_{TR2}$). The tool face angle differences $\beta_{TR1}$ and $\beta_{TR2}$ are a function of antenna orientation and are not changed by longitudinal rotation of the tool. The tool face angle $\beta$, however, may be changed, such as by rotating the logging tool 102 in-air or in a formation.

Equations 1 and 2 may be expressed in the Fourier expansion form shown in Equations 3 and 4, below:

$$Z_{TR1}(\beta) = A_{TR1}\cos(2\beta+\beta_{TR1}) + C_{TR1}\cos\beta + D_{TR1}\sin\beta + E_{TR1} \quad (3)$$

$$Z_{TR2}(\beta) = A_{TR2}\cos(2\beta+\beta_{TR2}) + C_{TR2}\cos\beta + D_{TR2}\sin\beta + E_{TR2} \quad (4)$$

where $A_{TR1}$, $C_{TR1}$, $D_{TR1}$, $E_{TR1}$, $A_{TR2}$, $C_{TR2}$, $D_{TR2}$, and $E_{TR2}$ are coefficients of each of the geometric terms of the Fourier transform. The Fourier transform coefficients are further given by Equations 5 to 11, below:

$$A_{TR1} = A_{TR2} = \frac{C_{xx} - C_{yy}}{2} \quad (5)$$

$$C_{TR1} = C_{zx}\cos\beta_{TR1} + C_{xz} \quad (6)$$

$$C_{TR2} = C_{zx}\cos\beta_{TR2} + C_{xz} \quad (7)$$

$$D_{TR1} = -C_{zx}\sin\beta_{TR1} \quad (8)$$

$$D_{TR2} = -C_{zx}\sin\beta_{TR2} \quad (9)$$

$$E_{TR1} = C_{zz} + \frac{(C_{xx}+C_{yy})\cos\beta_{TR1}}{2} \quad (10)$$

$$E_{TR2} = C_{zz} + \frac{(C_{xx}+C_{yy})\cos\beta_{TR2}}{2} \quad (11)$$

where C is a multi-component intermediate tensor representing the cross-component responses $C_{ij}$ (where i=x, y, z and j=x, y, z), and where $C_{ij}$ are independent of the transmitter angle $\theta_t$ and the receiver angle $\theta_r$. The components of the intermediate tensor C are related to the components of the tensor Z as shown in Equations 12 to 17, below.

$$C_{xx} = Z_{xx}\sin\theta_t \sin\theta_r \quad (12)$$

$$C_{yy} = Z_{yy}\sin\theta_t \sin\theta_r \quad (13)$$

$$C_{zz} = Z_{zz}\cos\theta_t \cos\theta_r \quad (14)$$

$$C_{xz} = Z_{xz}\sin\theta_t \cos\theta_r \quad (15)$$

$$C_{zx} = Z_{zx}\cos\theta_t \sin\theta_r \quad (16)$$

$$C_{xy} = C_{yx} = C_{zy} = C_{yz} = 0 \quad (17)$$

The intermediate tensor components $C_{xy}$, $C_{yx}$, $C_{zy}$, and $C_{yz}$ may be set equal to zero or may be ignored, as the cross-component response factors $Z_{xy}$, $Z_{yx}$, $Z_{zy}$, and $Z_{yz}$ are also equal to zero. The Fourier coefficients (i.e., $A_{TR1}$, $C_{TR1}$, $D_{TR1}$, $E_{TR1}$, $A_{TR2}$, $C_{TR2}$, $D_{TR2}$, and $E_{TR2}$) may be obtained via curve fitting. The tool face angle $\beta$ may be sampled in a number of bins—i.e., the tool body may be rotated about its longitudinal axis such that the tool face angle $\beta$ covers substantially all angles of orientation. Measurements may be taken for various rotational angles. For example, the tool face angle $\beta$ may be divided into thirty-two (32) bins, where each bin covers 11.25°, and where measurements of $Z_{TR1}(\beta)$ and $Z_{TR2}(\beta)$ are obtained for each location. Then the values of $Z_{TR1}(\beta)$ and $Z_{TR2}(\beta)$ as a function of the tool face angle $\beta$ may be used to determine other parameters, such as the Fourier coefficients, via curve fitting. A greater or lesser number of bins or rotational angle sampling rate may be used—such as 16 bins, 8 bins, continuous sampling, etc.

Traditionally, when the transmitter angle $\theta_t$ and the receiver angle $\theta_r$ are known, the cross-component response factors $Z_{ij}$ are solved for using Equations 5-17 and the measured responses $Z_{TR1}(\beta)$ and $Z_{TR2}(\beta)$ as a function of the tool face angle $\beta$ for a rotated tool. However, if the transmitter angle $\theta_t$ and the receiver angle $\theta_r$ are not known or are uncertain, then Equations 5-11 may instead be solved for the intermediate tensor C and its components $C_{ij}$ may be given by Equations 18-22, below for the solution in a test formation R:

$$C_{xx} = A_{TR1} - \frac{(E_{TR1} - E_{TR2})}{\cos\beta_{TR2} - \cos\beta_{TR1}} \tag{18}$$

$$C_{yy} = -\frac{(E_{TR1} + E_{TR2})}{\cos\beta_{TR2} - \cos\beta_{TR1}} - A_{TR1} \tag{19}$$

$$C_{zz} = \frac{E_{TR1}\cos\beta_{TR2} - E_{TR2}\cos\beta_{TR1}}{\cos\beta_{TR2} - \cos\beta_{TR1}} \tag{20}$$

$$C_{xz} = \frac{C_{TR1}\sin\beta_{TR2} + D_{TR1}\cos\beta_{TR1}}{\sin\beta_{TR2}} \tag{21}$$

$$C_{zx} = -\frac{D_{TR1}}{\sin\beta_{TR1}} \tag{22}$$

R may be an arbitrary test formation—for example a one-dimensional formation with an arbitrary number of layers.

The logging tool may be calibrated through an air-hang calibration. In an air-hang calibration, the receiver antenna response to the transmitter antenna emission may be measured while the logging tool 102 is in air. In air, the cross-components $C_{xz}$ and $C_{zx}$ are approximately zero. This allows the air-hang components of the intermediate tensor C to be solved for using air-hang versions of Equations 5-11, shown as Equations 23-27, below:

$$A_{TR1Air} = A_{TR2Air} = \frac{c_{xxAir} - c_{yyAir}}{2} \tag{23}$$

$$C_{TR1Air} = C_{TR2Air} = 0 \tag{24}$$

$$D_{TR1Air} = D_{TR2Air} = 0 \tag{25}$$

$$E_{TR1Air} = C_{zzAir} + \frac{(C_{xxAir} + C_{yyAir})\cos\beta_{TR1Air}}{2} \tag{26}$$

$$E_{TR2Air} = C_{zzAir} + \frac{(C_{xxAir} - C_{yyAir})\cos\beta_{TR2Air}}{2} \tag{27}$$

where $C_{xxAir}$, $C_{yyAir}$, $C_{zzAir}$ are the diagonal components of the intermediate tensor C in air, where $A_{TR1Air}$, $E_{TR1Air}$, and $E_{TR2Air}$ are the coefficients of the Fourier components in air, and where $\beta_{TR1Air}$ and $\beta_{TR2Air}$ are the tool face angles for the transmitter antenna 104 and the first receiver antenna 106 and the transmitter antenna 104 and the second receiver antenna 108, respectively, in air.

The diagonal components of the intermediate tensor C in air may then be solved for using Equations 28-31, below:

$$C_{xxAir} = A_{TR1Air} - \frac{(E_{TR1Air} - E_{TR2Air})}{\cos\beta_{TR2Air} - \cos\beta_{TR1Air}} \tag{28}$$

$$C_{yyAir} = -\frac{(E_{TR1Air} + E_{TR2Air})}{\cos\beta_{TR2Air} - \cos\beta_{TR1Air}} - A_{TR1Air} \tag{29}$$

$$C_{zzAir} = \frac{E_{TR1Air}\cos\beta_{TR2Air} - E_{TR2Air}\cos\beta_{TR1Air}}{\cos\beta_{TR2Air} - \cos\beta_{TR1Air}} \tag{30}$$

$$C_{xzAir} = C_{zxAir} = 0 \tag{31}$$

where $C_{xxAir}$, $C_{yyAir}$, $C_{zzAir}$, $C_{xzAir}$, and $C_{zxAir}$ are the components of the intermediate tensor C in air, and other terms are as previously described.

Equations 12-17 may be rewritten to solve for the equations for the cross-component response factors $Z_{ij}$ of the tensor Z as shown in Equations 32-35, below:

$$Z_{xx} = \frac{C_{xx}}{\sin\theta_t \sin\theta_r} \tag{32}$$

$$Z_{yy} = \frac{C_{yy}}{\sin\theta_t \sin\theta_r} \tag{33}$$

$$Z_{zz} = \frac{C_{zz}}{\cos\theta_t \cos\theta_r} \tag{34}$$

$$Z_{xz} = \frac{C_{xz}}{\sin\theta_t \cos\theta_r} \tag{35}$$

$$Z_{zx} = \frac{C_{zx}}{\cos\theta_t \sin\theta_r} \tag{36}$$

$$Z_{xy} = Z_{yx} = Z_{zy} = Z_{yz} = 0 \tag{37}$$

where cross-components $C_{xy}$, $Z_{xy}$, $C_{yx}$, $Z_{yx}$, $C_{zy}$, $Z_{zy}$, $C_{yz}$ and $Z_{yz}$ are zero.

For the air-hang tensor components, Equations 12-17 may be reduced to Equations 38-43, below:

$$Z_{xxAir} = \frac{C_{xxAir}}{\sin\theta_t \sin\theta_r} \tag{38}$$

$$Z_{yyAir} = \frac{C_{yyAir}}{\sin\theta_t \sin\theta_r} \tag{39}$$

$$Z_{zzAir} = \frac{C_{zzAir}}{\cos\theta_t \cos\theta_r} \tag{40}$$

$$Z_{xzAir} = \sqrt{\frac{C_{xxAir}}{\sin\theta_t \sin\theta_r} \frac{C_{zzAir}}{\cos\theta_t \cos\theta_r}} \tag{41}$$

$$Z_{zxAir} = \sqrt{\frac{C_{zzAir}}{\cos\theta_t \cos\theta_r} \frac{C_{xxAir}}{\sin\theta_t \sin\theta_r}} \tag{42}$$

$$Z_{xyAir} = Z_{yxAir} = Z_{zyAir} = Z_{yzAir} = 0 \tag{43}$$

where $Z_{xxAir}$, $Z_{yyAir}$, $Z_{zzAir}$, $Z_{xzAir}$, and $Z_{zxAir}$ are the non-zero components of the response tensor Z in air.

The calibrated cross-component response factors $Z_{zxAir}$ and $Z_{xzAir}$ are calculated using Equation 44, below:

$$Z_{xzAir} = Z_{zxAir} = \sqrt{Z_{xxAir} Z_{zzAir}} \tag{44}$$

where $Z_{xzAir}$ and $Z_{zxAir}$ may be approximated from the $Z_{xxAir}$ and $Z_{zzAir}$ components in air.

A relationship between the air-hang response tensor components and intermediate tensor components and the information response tensor components and intermediate tensor components may be calculated which is independent of both the transmitter angle $\theta_t$ and the receiver angle $\theta_r$. For each component $Z_{ij}$ and $C_{ij}$, a ratio may be calculated as shown in Equations 45-49, below:

$$Z_{xxCal} = \frac{Z_{xx}}{Z_{xxAir}} = \frac{C_{xx}}{C_{xxAir}} \quad (45)$$

$$Z_{yyCal} = \frac{Z_{yy}}{Z_{yyAir}} = \frac{C_{yy}}{C_{yyAir}} \quad (46)$$

$$Z_{zzCal} = \frac{Z_{zz}}{Z_{zzAir}} = \frac{C_{zz}}{C_{zzAir}} \quad (47)$$

$$Z_{xzCal} = \frac{Z_{xz}}{Z_{xzAir}} = \frac{C_{xz}}{\sqrt{C_{xxAir}C_{zzAir}}} \frac{\sqrt{\sin\theta_t \cos\theta_r \cos\theta_t \sin\theta_r}}{\sin\theta_t \cos\theta_r} \quad (48)$$

$$Z_{zxCal} = \frac{Z_{zx}}{Z_{zxAir}} = \frac{C_{zx}}{\sqrt{C_{xxAir}C_{zzAir}}} \frac{\sqrt{\sin\theta_t \cos\theta_r \cos\theta_t \sin\theta_r}}{\cos\theta_t \sin\theta_r} \quad (49)$$

where $Z_{xxCal}$, $Z_{yyCal}$, and $Z_{zzCal}$ are the calibrated cross-component response factors and are independent from the transmitter angle $\theta_t$ and the receiver angle $\theta_r$, because $C_{ij}$ and $C_{ijAir}$ are independent of the transmitter angle $\theta_t$ and the receiver angle $\theta_r$.

The calibrated cross-component response factors $Z_{zxCal}$ and $Z_{xzCal}$, where the transmitter angle $\theta_t$ is equal to the receiver angle $\theta_r$, reduce, as shown in Equations 49-50.

$$Z_{zxCal} = \frac{C_{zx}}{\sqrt{C_{xxAir}C_{zzAir}}} \quad (50)$$

$$Z_{xzCal} = \frac{C_{xz}}{\sqrt{C_{xxAir}C_{zzAir}}} \quad (51)$$

When the transmitter angle $\theta_t$ is not equal to the receiver angle $\theta_r$, the trigonometric terms do not cancel out. However, as the transmitter angle $\theta_t$ and the receiver angle $\theta_r$ do not change (i.e., the antenna orientation angles are static once the tool is constructed), the trigonometric terms become constant multiplier terms, where the constants are a real number. This is expressed in Equations 52-53, below:

$$Z_{zxCal} = \frac{C_{zx}}{\sqrt{C_{xxAir}C_{zzAir}}} \text{Constant}_1 \quad (52)$$

$$Z_{xzCal} = \frac{C_{xz}}{\sqrt{C_{xxAir}C_{zzAir}}} |\text{Constant}_2| \quad (53)$$

where $\text{Constant}_1$ and $\text{Constant}_2$ are constants across different formations and different depths as they are properties of the unchanging the transmitter angle $\theta_t$ and the receiver angle $\theta_r$ of the logging tool 102.

When the transmitter angle $\theta_t$ and the receiver angle $\theta_r$ are approximately equal, the constant terms approach unity, as shown in Equations 54-55, for the assumption $\theta_t \approx \theta_r \approx \theta$.

$$\frac{\sqrt{\sin\theta_t \cos\theta_r \cos\theta_t \sin\theta_r}}{\sin\theta_t \cos\theta_r} \approx \frac{\sqrt{\sin\theta \cos\theta \cos\theta \sin\theta}}{\sin\theta \cos\theta} \approx 1 \quad (54)$$

$$\frac{\sqrt{\sin\theta_t \cos\theta_r \cos\theta_t \sin\theta_r}}{\cos\theta_t \sin\theta_r} \approx \frac{\sqrt{\sin\theta \cos\theta \cos\theta \sin\theta}}{\cos\theta \sin\theta} \approx 1 \quad (55)$$

If the transmitter angle $\theta_t$ and the receiver angle $\theta_r$ are similar but not equal, the constant terms (i.e., $\text{Constant}_1$ and $\text{Constant}_2$) effect the amplitude of $Z_{zxCal}$ and $Z_{xzCal}$ but not phase. This allows calculation of the ratio between the air-hang and formation cross-component response factors for the cross-component response tensor Z. The ratio of $Z_{ij}$ to $Z_{ijAir}$ (which is given by $Z_{ijCal})_{is}$ exact for $Z_{xx}$, $Z_{yy}$, and $Z_{zz}$ approximate for $Z_{xz}$ and $Z_{zx}$. Therefore, the response signals may be calibrated based on the intermediate cross-component response tensor C and inversion or other operations performed based on transmitter and receiver pairs with unequal or undetermined transmitter angles and receiver angles.

Example Flow Diagrams

Figure 2:
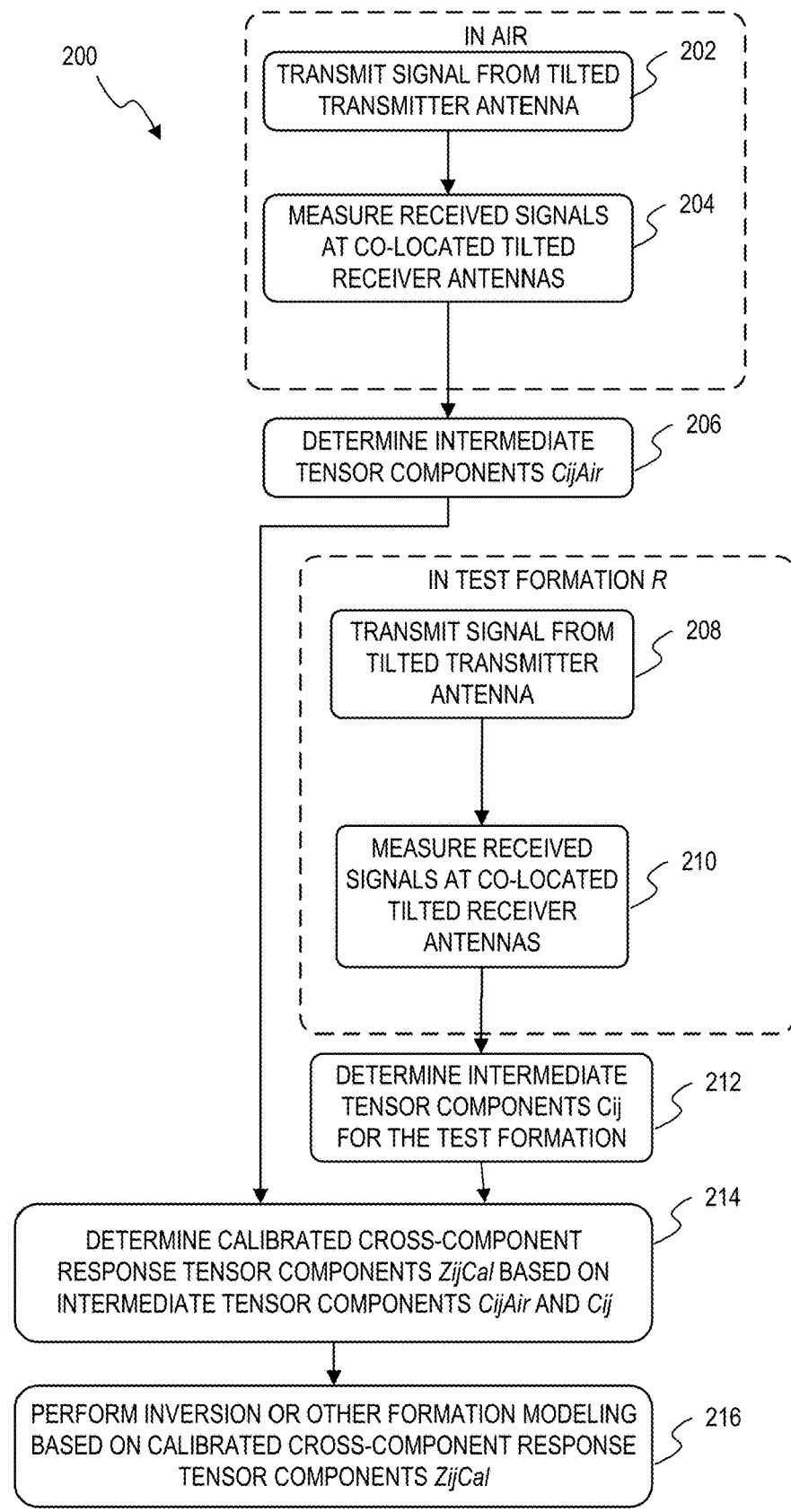
FIG. 2 depicts a flow diagram illustrating example operations for configuring a logging tool to utilize signal information independent of antenna tilt-angles, according to some embodiments.

FIG. 2 depicts a flow diagram illustrating example operations for configuring a logging tool to utilize signal information independent of antenna tilt-angles, according to some embodiments. In the operations shown in FIG. 2, the logging tool 102 may take signal measurements in the air (or via a substantially nonconductive material). More specifically, at block 202, the logging tool 102 may transmit a signal from a tilted transmitter antenna (such as the transmitter antenna 104). In some implementations, this is performed as the logging tool 102 is rotating. In some implementations, the tilt-angle of the first receiver antenna 106 may be the negative tilt angle of the second receiver antenna 108. At block 204, the logging tool 102 may measure signals received at co-located tilted receiver antennas, such as the first receiver antenna 106 and the second receiver antenna 108. In some implementations, the first and second receiver antennas 106 and 108 may measure signals as the logging tool 102 rotates in air (such as by taking 32 measurements for each rotation of the logging tool 102). The logging tool 102 may determine tensor components (e.g., $Z_{ijAIR}$) for the in-air signal measurements, such as by using components that implement, among other operations, Equations 1-4. At block 208, the logging tool 102 may determine intermediate tensor components for the in-air signal measurements, such as by using components that implement, among other operations, Equations 18-31.

In addition to measuring the in-air signals, the logging tool 102 also may measure signals in a test formation. More specifically, at block 208, the logging tool 102 may transmit a signal from a tilted transmitter antenna (such as the transmitter antenna 104) as the logging tool 102 rotates in the test formation. In some implementations, the tilt-angle of the first receiver antenna 106 may be the negative tilt angle of the second receiver antenna 108. At block 210, the logging tool 102 may measure signals received at co-located tilted receiver antennas, such as the first receiver antenna 106 and the second receiver antenna 108. In some implementations, the first and second receiver antennas 106 and 108 may measure signals as the logging tool 102 rotates in the test formation (such as by taking 32 measurements for each rotation of the logging tool 102). The logging tool 102 may determine tensor components (e.g., $Z_{ij}$ for the test formation) for the signal measurements from the test formation, such as by using components that implement, among other operations, Equations 1-4. At block 212, the logging tool 102 may determine intermediate tensor components (e.g., $C_{ij}$) for signal measurements taken in the test formation, such as by using components that implement, among other operations, Equations 18-22.

At block 214, as part of the air-hang calibration, the logging tool 102 may determine calibrated cross-component response tensor components (e.g., $Z_{ijCAL}$) based on the intermediate tensor components (e.g., $C_{ijAIR}$ and $C_{ij}$), such as by using components that implement, among other operations, Equations 52 and 53.

At block 216, the logging tool may perform inversion modeling or other suitable formation modeling based on the calibrated cross-component response tensor components (e.g., $Z_{ijCAL}$). From block 216, the flow ends.

Figure 3:
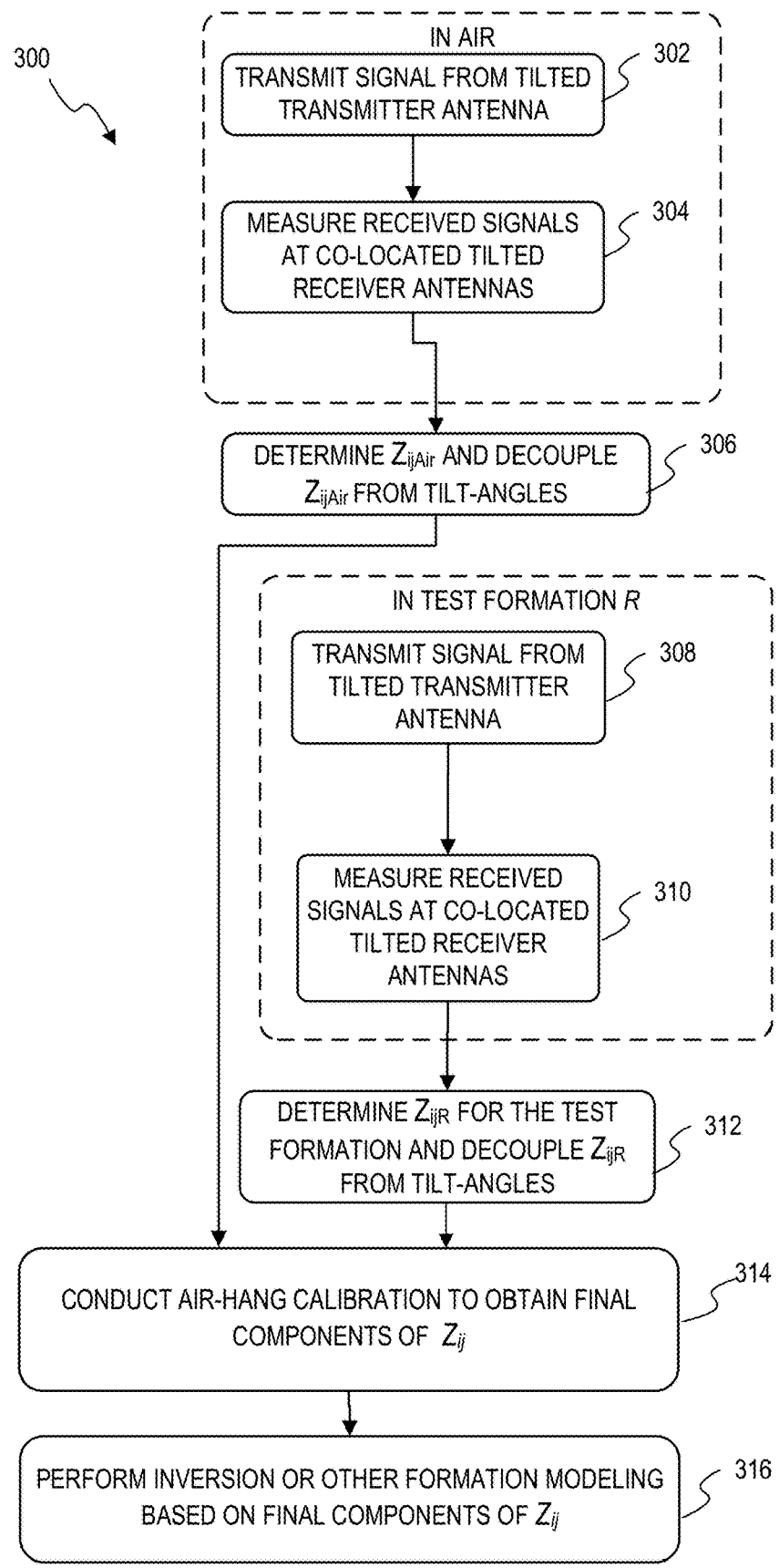
FIG. 3 depicts a flow diagram illustrating example operations for configuring a logging tool to utilize signal information independent of antenna tilt-angles, according to some embodiments.

FIG. 3 depicts a flow diagram illustrating example operations for configuring a logging tool to utilize signal information independent of antenna tilt-angles, according to some embodiments. In the operations shown in FIG. 3, the logging tool 102 may take signal measurements in the air (or via a substantially nonconductive material). More specifically, at block 302, the logging tool 102 may transmit a signal from a tilted transmitter antenna (such as the transmitter antenna 104). In some implementations, this is performed as the logging tool 102 is rotating. In some implementations, the tilt-angle of the first receiver antenna 106 may be the negative tilt angle of the second receiver antenna 108. At block 304, the logging tool 102 may measure signals received at co-located tilted receiver antennas, such as the first receiver antenna 106 and the second receiver antenna 108. In some implementations, the first and second receiver antennas 106 and 108 may measure signals as the logging tool 102 rotates in air (such as by taking 32 measurements for each rotation of the logging tool 102). At block 308, the logging tool 102 may determine tensor components (e.g., $Z_{ijAIR}$) for the in-air signal measurements, such as by performing operations that implement Equations 1-4. Hence, these tensor components for $Z_{ijAIR}$ are decoupled from the tilt-angles of the antennas 104, 106, and 108.

In addition to measuring the in-air signals, the logging tool 102 also may measure signals in a test formation. More specifically, at block 308, the logging tool 102 may transmit a signal from a tilted transmitter antenna (such as the transmitter antenna 104) as the logging tool 102 rotates in the test formation R. In some implementations, the tilt-angle of the first receiver antenna 106 may be the negative tilt angle of the second receiver antenna 108. At block 310, the logging tool 102 may measure signals received at co-located tilted receiver antennas, such as the first receiver antenna 106 and the second receiver antenna 108. In some implementations, the first and second receiver antennas 106 and 108 may measure signals as the logging tool 102 rotates in the test formation (such as by taking 32 measurements for each rotation of the logging tool 102). At block 312, the logging tool 102 may determine tensor components (e.g., $Z_{ijR}$) for the signal measurements from the test formation, such as by performing operations that implement Equations 1-4. Hence, these tensor components for $Z_{ijR}$ are decoupled from the tilt-angles of the antennas 104, 106, and 108.

At block 314, the logging tool 102 may conduct an air-hang calibration to obtain final components for $Z_{ij}$, such as by performing operations that result in tensor component values shown in Equations 52 and 53.

At block 316, the logging tool may perform inversion modeling or other suitable formation modeling based on the final components of $Z_{ij}$. From block 316, the flow ends.

Figure 4A:
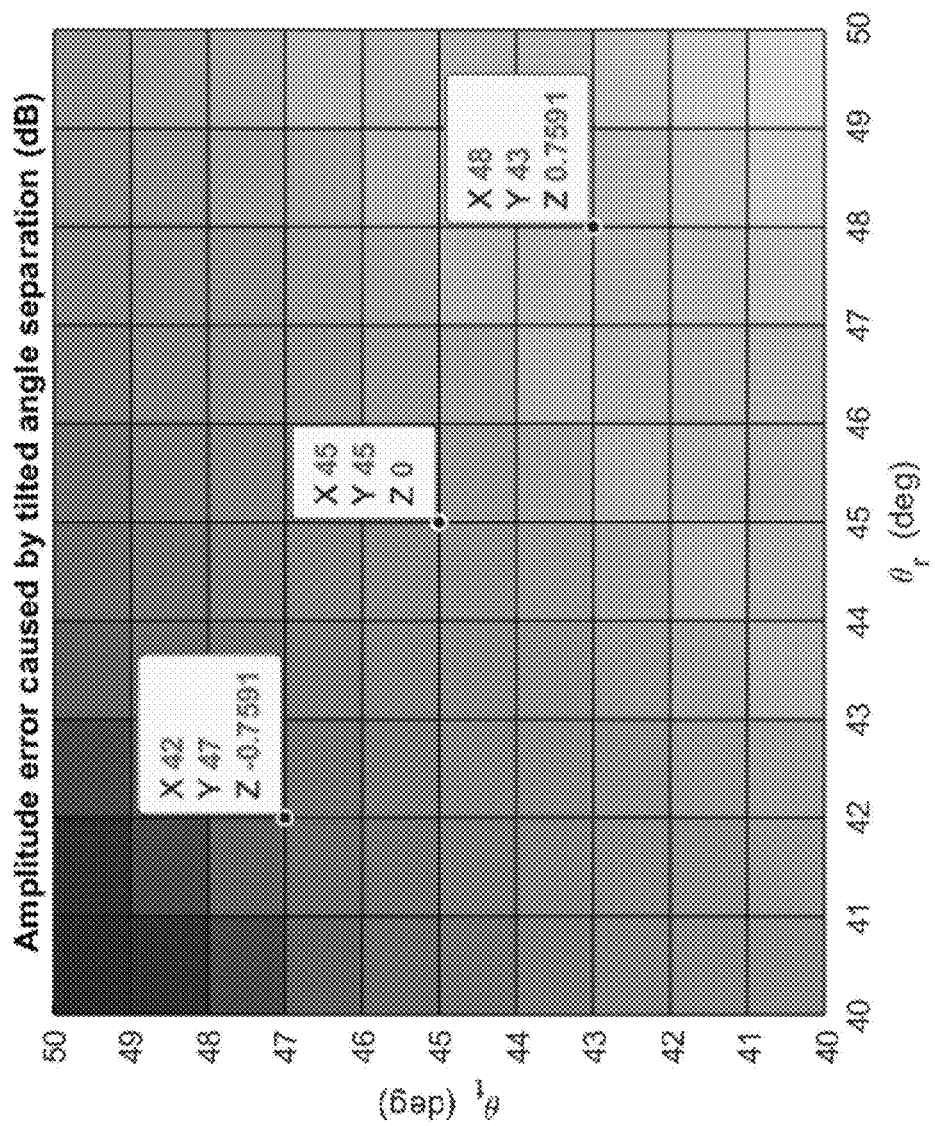
FIG. 4A depicts a chart illustrating an example of amplitude error, according to some embodiments.

FIG. 4A is a chart illustrating an example of amplitude error. In FIG. 4, the chart 400 shows an example amplitude error in a tensor cross component caused by tilt-angle separation between a transmitter antenna (e.g., the transmitter antenna 104) and a receiver antenna (such as the first receiver antenna 106). The amplitude error may increase when the separation between $\theta_t$ and $\theta_r$ increases. The amplitude error may be around 0.76 dB for a five-degree separation. This amplitude error should not have a substantial impact on an inversion process (or other operations) because the amplitude of cross components is normally in the range 20-40 dB. In some implementations, this error may be reduced by minimizing tilt-angle separation of the antennas.

Figure 4B:
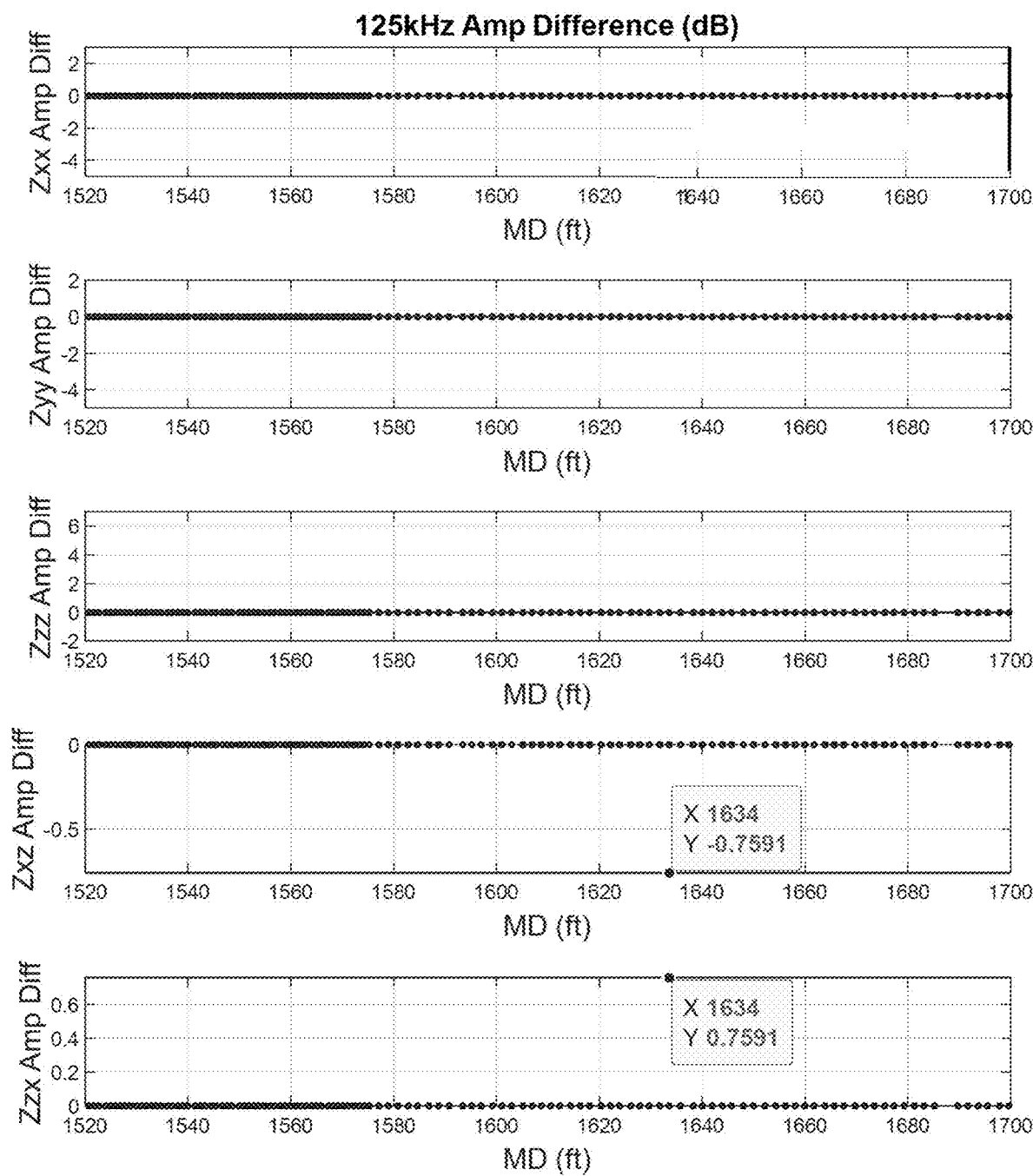
FIG. 4B is a tabular illustration of multi-components plotted in in amplitude and phase, according to some embodiments.

FIG. 4B is a tabular illustration of multi-components plotted in in amplitude and phase. At least one implementation was tested with synthetic data. A field test profile may be used as a resistivity log to generate a set of modeling components as true components. A different azimuthal tool response $Z_{TR1/2}(\beta)$ may be calculated based on Equation (1) with different $(\theta_t, \theta_r)$. A corresponding air-hang response $Z_{AirTR1/2}(\beta)$ may be calculated for respective $(\theta_t, \theta_r)$. For each set of $(\theta_t, \theta_r)$, the processing method described in Equations (5)-(53) may employed to decouple the $[Z_{ij}]$ multi-component tensor from the antenna tilt-angles. The resulting multi-components are plotted in FIG. 4A in amplitude and phase. In some implementations, for different $(\theta_t, \theta_r)$, the decoupled components are relatively close to the true components.

Figure 4C:
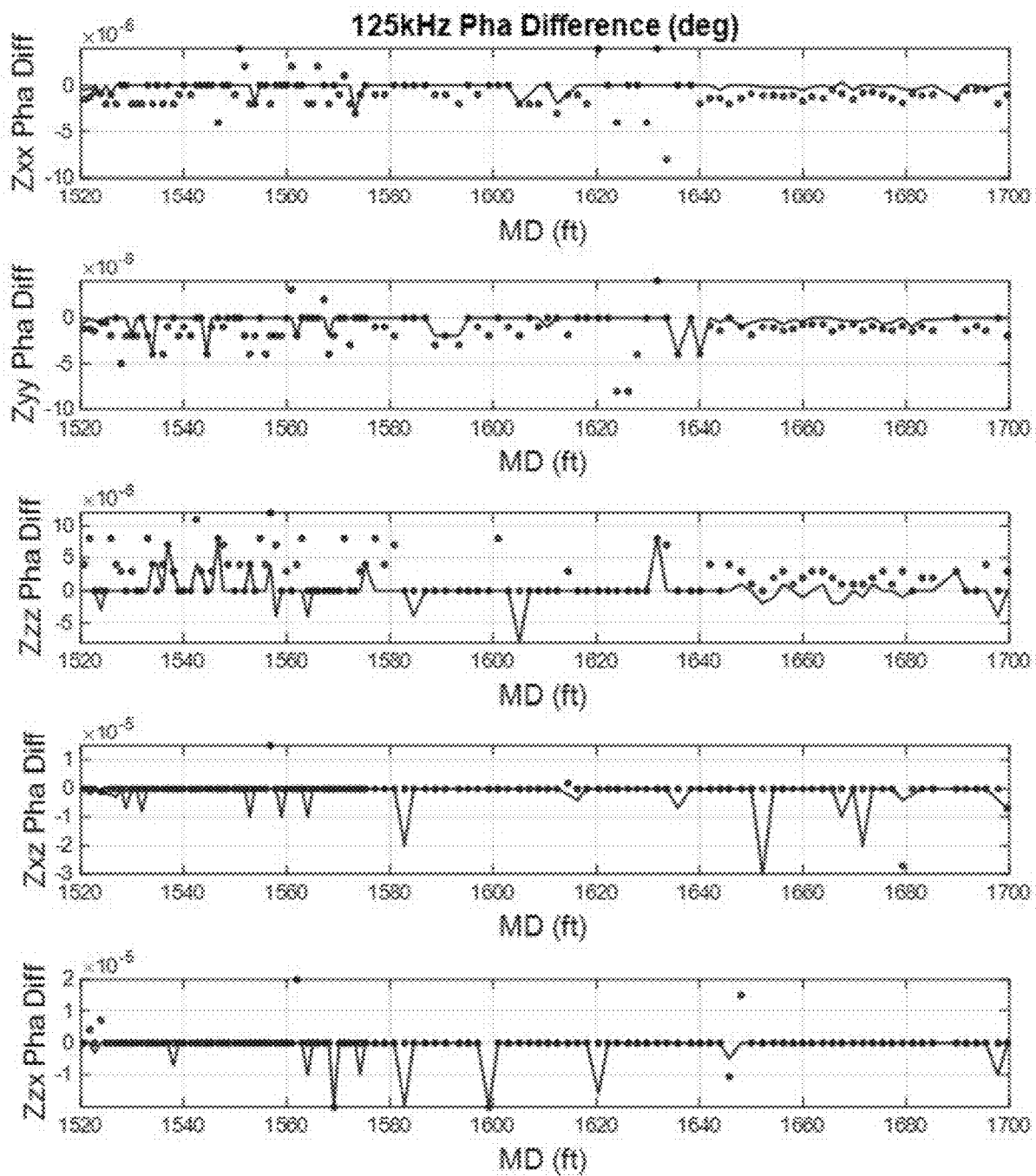
FIG. 4C shows plot-graphs illustrating the difference between computed tensor components and true tensor components, according to some embodiments.

FIG. 4C shows plot-graphs illustrating the difference between computed tensor components and true tensor components. The plot-graphs show an error associated with the tensor components. If $\theta_t = \theta_r$ and both are off a desired tilt-angle of 45 deg, the decoupled tensor components are the same as the true components per the techniques described herein. In some implementations, there may be a small constant error in cross component amplitude when $\theta_t \neq \theta_r$. This error may be relatively small compared to the true component level as seen in FIG. 4B.

The flowcharts are provided to aid in understanding the illustrations and are not to be used to limit scope of the claims. The flowcharts depict example operations that may vary within the scope of the claims. Additional operations may be performed; fewer operations may be performed; the operations may be performed in parallel, and the operations may be performed in a different order. For example, the operations depicted in FIG. 3 may be performed in parallel or concurrently.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations may be organized differently in accordance with any one of platform (operating system and/or hardware), application ecosystem, interfaces, programmer preferences, programming language, administrator preferences, etc.

Any combination of one or more machine-readable medium(s) may be utilized. The machine-readable medium may be a machine-readable signal medium or a machine-readable storage medium. In the context of this document, a machine-readable storage medium may be any tangible medium that may contain or store a program for use by or in connection with an instruction execution system, apparatus, or device. A machine-readable storage medium is not a machine-readable signal medium.

A machine-readable signal medium may include a propagated data signal with machine-readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that may communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object-oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine-readable medium that may direct a machine to function in a particular manner, such that the instructions stored in the machine-readable medium produce an article of manufacture including instructions which implement the function/act specified in the flowchart and/or block diagram block or blocks.

Example Computer

Figure 5:
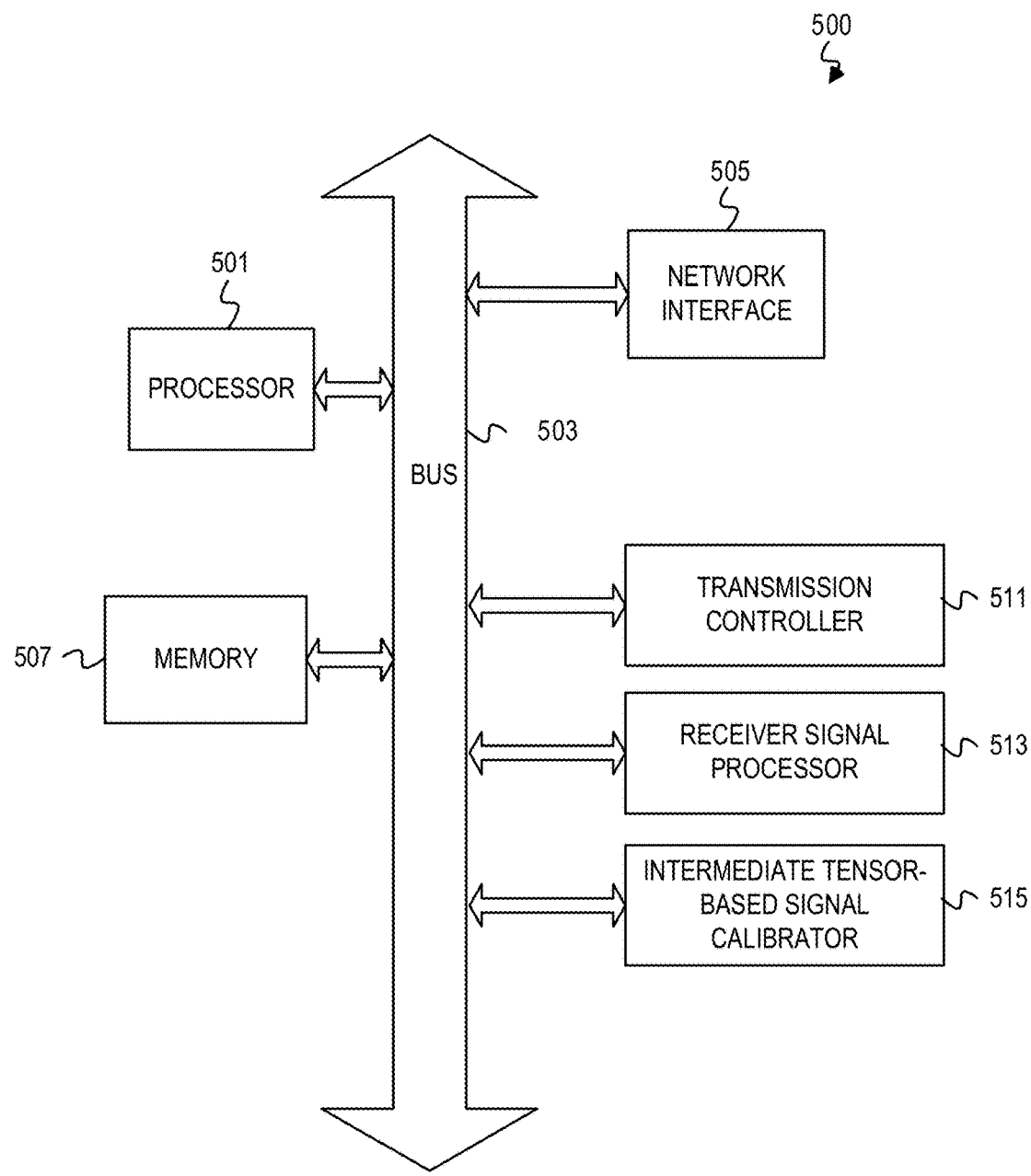
FIG. 5 depicts an example computer, according to some embodiments.

FIG. 5 depicts an example computer, according to some embodiments. A computer 500 may include one or more processors 501 (possibly including multiple cores, multiple nodes, and/or implementing multi-threading, etc.). The computer 500 may include memory 507. The memory 507 may be system memory or any one or more of the above already described possible implementations of machine-readable media. The computer 500 also may include a bus 503 and a network interface 505. The computer 500 also may include a transmission controller 511 that may control signal transmissions, such as by the transmitter antenna 104, as described herein. The computer 500 also may include a receiver signal processor 513 that may control receipt and processing of signals received by the first receiver antenna 106 and the second receiver antenna 108. The functionality described herein may be implemented with an application-specific integrated circuit, in logic implemented in the processor 501, in a co-processor on a peripheral device or card, etc. Further, implementations may include fewer or additional components not illustrated in FIG. 5 (e.g., video cards, audio cards, additional network interfaces, peripheral devices, etc.). The processor 501 and the network interface 505 may be coupled to the bus 503. Although illustrated as being coupled to the bus 503, the memory 507 may be coupled to the processor 501. The computer 500 may be part of the logging tool 102, communicatively coupled with the logging tool 102, or otherwise utilized to achieve the functionality described herein.

Example Systems

Figure 6:
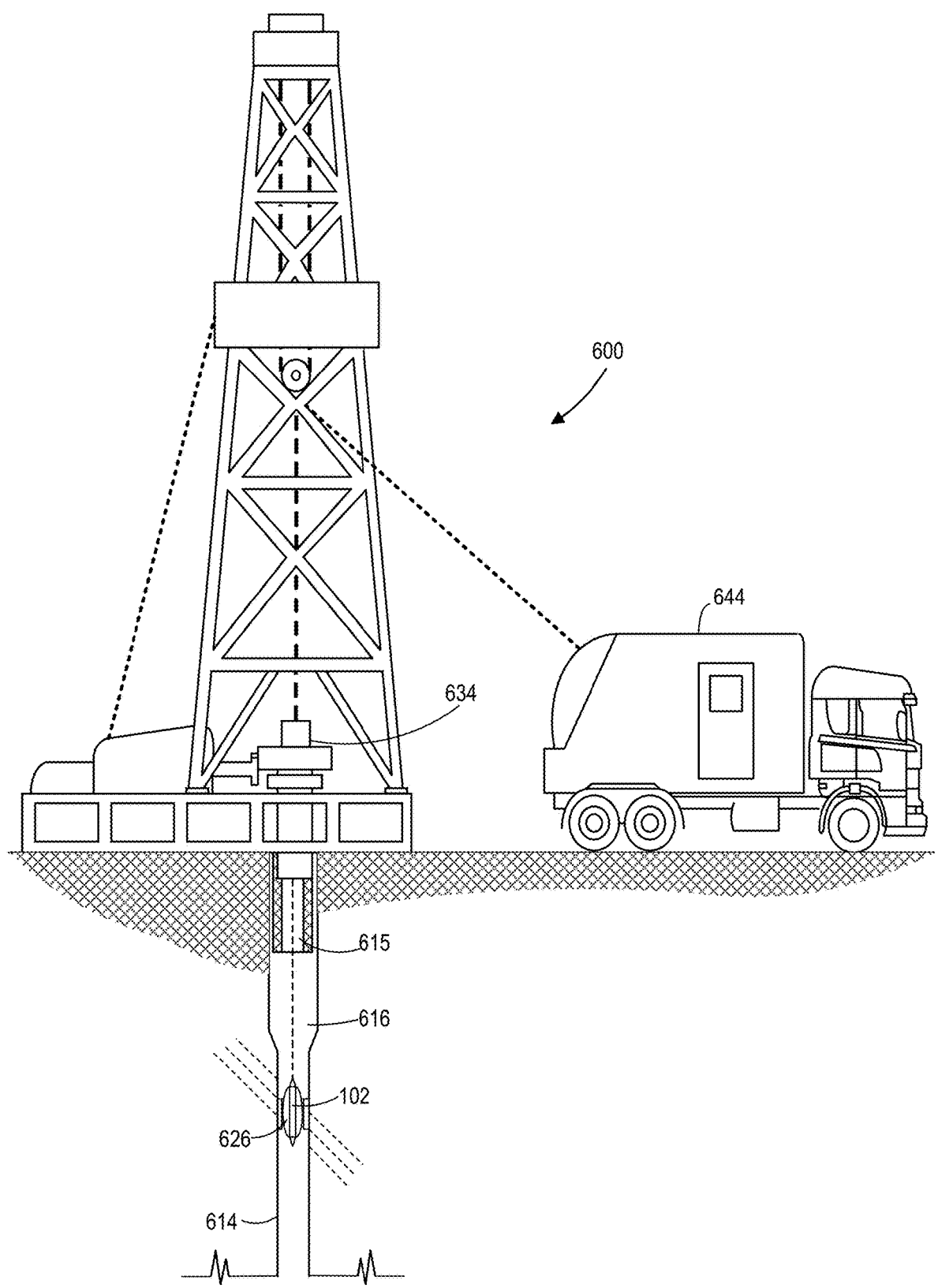
FIG. 6 depicts an example wireline system, according to some embodiments.

FIG. 6 depicts an example wireline system, according to some embodiments. A system 600 may be used in an illustrative logging environment with a drillstring removed, in accordance with some embodiments of the present disclosure.

Subterranean operations may be conducted using a wireline system 620 once the drillstring has been removed, though, at times, some or all of the drillstring may remain in a borehole 614 during logging with the wireline system 620. The wireline system 620 may include one or more logging tools 102 that may be suspended in the borehole 614 by a conveyance 616 (e.g., a cable, slickline, or coiled tubing). The logging tool 102 may be communicatively coupled to the conveyance 615. The conveyance 615 may contain conductors for transporting power to the wireline system 620 and telemetry from the logging tool 626 to a logging facility 644. The logging facility 644 may comprises an intermediate tensor-based calibrator capable enabling the logging tool 102 to utilize signal information without prior knowledge of antenna tilt-angles, as described herein. Alternatively, the conveyance 615 may lack a conductor, as is often the case using slickline or coiled tubing, and the wireline system 620 may contain a control unit 634 that contains memory, one or more batteries, and/or one or more processors for performing operations and storing measurements.

In certain implementations, the control unit 634 may be positioned at the surface, in the borehole (e.g., in the conveyance 615 and/or as part of the logging tool 102) or both (e.g., a portion of the processing may occur downhole and a portion may occur at the surface). The control unit 634 may include a control system or a control algorithm. In certain embodiments, a control system, an algorithm, or a set of machine-readable instructions may cause the control unit 634 to generate and provide an input signal to one or more elements of the logging tool 626, such as the sensors along the logging tool 102. The input signal may cause the sensors to be active or to output signals indicative of sensed properties. The logging facility 644 (shown in FIG. 6 as a truck, although it may be any other structure) may collect measurements from the logging tool 626, and may include computing facilities for controlling, processing, or storing the measurements gathered by the logging tool 102. The computing facilities may be communicatively coupled to the logging tool 102 by way of the conveyance 615 and may operate similarly to the control unit 634. In certain example embodiments, the control unit 634, which may be located in logging tool 102, may perform one or more functions of the computing facility.

The logging tool 102 may include a mandrel and a number of extendible arms coupled to the mandrel. One or more pads may be coupled to each of the extendible arms. Each of the pads may have a surface facing radially outward from the mandrel. Additionally, at least a sensor may be disposed on the surface of each pad. During operation, the extendible arms may be extended outwards to a wall of the borehole to extend the surface of the pads outward against the wall of the borehole. The sensors of the pads of each extendible arm may detect image data to create captured images of the formation surrounding the borehole.

Figure 7:
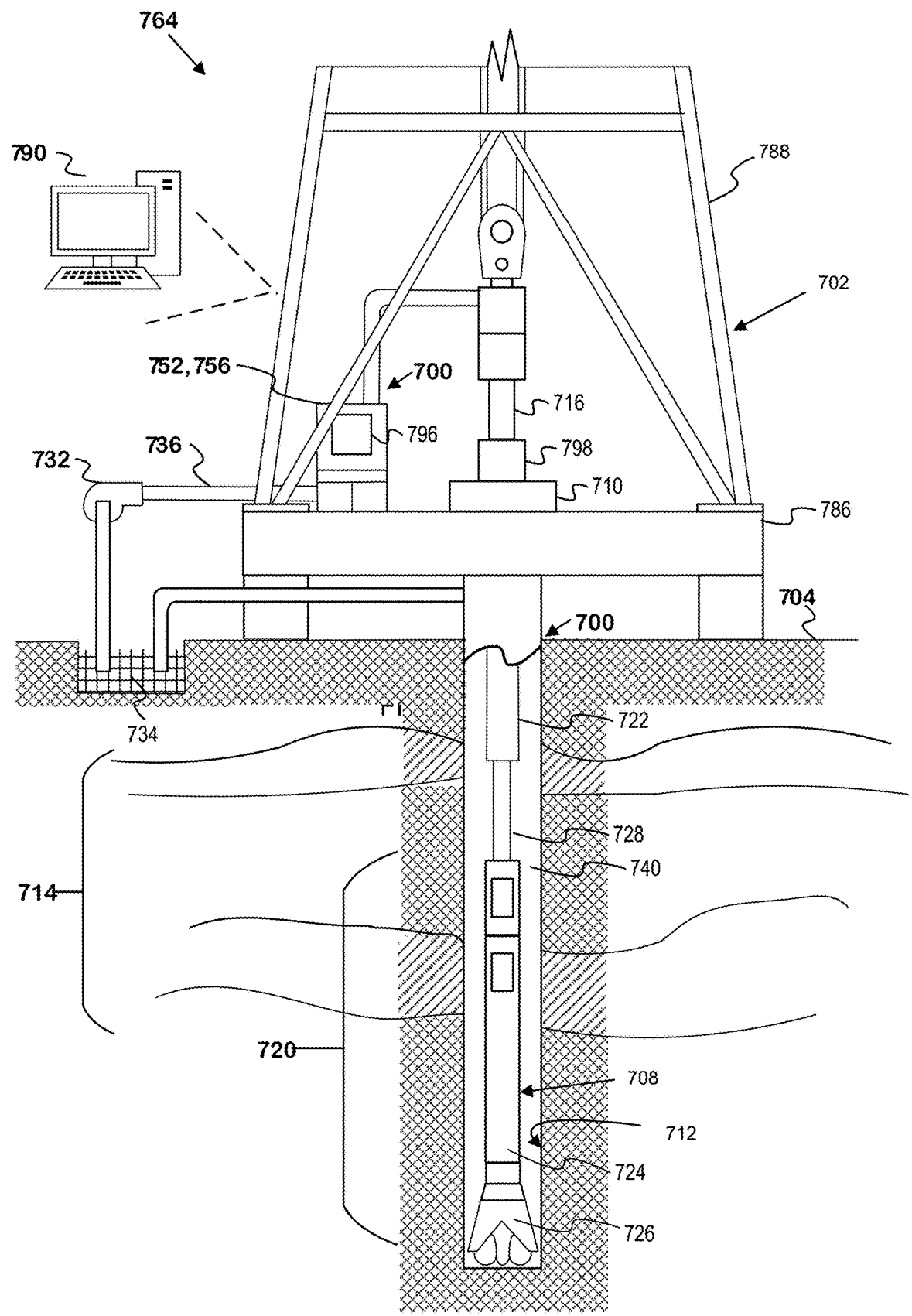
FIG. 7 depicts an example drilling rig system, according to some embodiments.

FIG. 7 depicts an example drilling rig system, according to some embodiments. For example, in FIG. 7 it can be seen how a system 764 may also form a portion of a drilling rig 702 located at the surface 704 of a well 706. Drilling of oil and gas wells is commonly carried out using a string of drill pipes connected together so as to form a drilling string 708 that may be lowered through a rotary table 710 into a wellbore or borehole 712. Here a drilling platform 786 may be equipped with a derrick 788 that supports a hoist. A computer system 790 (e.g., similar to the computer 500) may be communicatively coupled to any measurement devices attached to the system 764 and may configured the system 764 to utilize signal information without prior knowledge of antenna tilt-angles, as described herein.

The drilling rig 702 may thus provide support for the drill string 708. The drill string 708 may operate to penetrate the rotary table 710 for drilling the borehole 712 through subsurface formations 714. The drill string 708 may include a Kelly 716, drill pipe 718, and a bottom hole assembly 720, perhaps located at the lower portion of the drill pipe 718.

The bottom hole assembly 720 may include drill collars 722, a down hole tool 724, and a drill bit 726. The drill bit 726 may operate to create a borehole 712 by penetrating the surface 704 and subsurface formations 714. The down hole tool 724 (e.g., similar to the logging tool 102) may comprise any of a number of different types of tools including MWD tools, LWD tools, and others.

During drilling operations, the drill string 708 (perhaps including the Kelly 716, the drill pipe 718, and the bottom hole assembly 720) may be rotated by the rotary table 710. In addition to, or alternatively, the bottom hole assembly 720 may also be rotated by a motor (e.g., a mud motor) that may be located down hole. The drill collars 722 may be used to add weight to the drill bit 726. The drill collars 722 may also operate to stiffen the bottom hole assembly 720, allowing the bottom hole assembly 720 to transfer the added weight to the drill bit 726, and in turn, to assist the drill bit 726 in penetrating the surface 704 and subsurface formations 714.

During drilling operations, a mud pump 732 may pump drilling fluid (sometimes known by those of ordinary skill in the art as "drilling mud") from a mud pit 734 through a hose 736 into the drill pipe 718 and down to the drill bit 726. The drilling fluid may flow out from the drill bit 726 and be returned to the surface 704 through an annular area 740 between the drill pipe 718 and the sides of the borehole 712. The drilling fluid may then be returned to the mud pit 734, where such fluid may be filtered. In some embodiments, the drilling fluid may be used to cool the drill bit 726, as well as to provide lubrication for the drill bit 726 during drilling operations. Additionally, the drilling fluid may be used to remove subsurface formation 714 cuttings created by operating the drill bit 726. It may be the images of these cuttings that many implementations operate to acquire and process.

Example Operations

Figure 8:
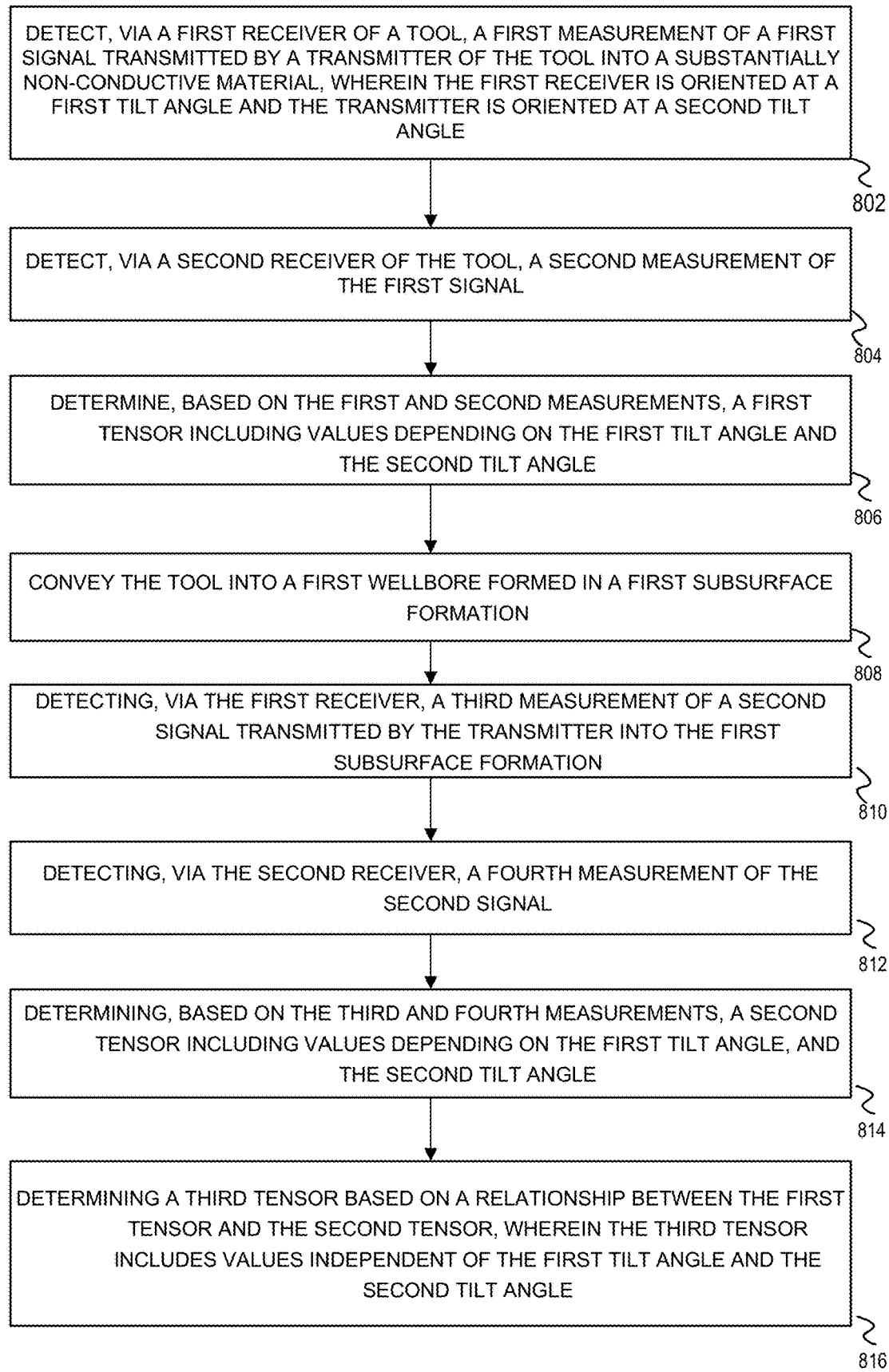
FIG. 8 is a flowchart of example operations for configuring a logging tool to utilize signal information independent of antenna tilt-angles, according to some embodiments.

FIG. 8 depicts a flowchart of example operations for configuring a logging tool to utilize signal information independent of antenna tilt-angles, according to some embodiments. The operations may include detecting, via a first receiver of a tool, a first measurement of a first signal transmitted by a transmitter of the tool into a substantially non-conductive material, wherein the first receiver is oriented at a first tilt angle and the transmitter is oriented at a second tilt angle (block 802). The operations may include detecting, via a second receiver of the tool, a second measurement of the first signal. The operations may include determining, based on the first and second measurements, a first tensor including values depending on the first tilt angle and the second tilt angle. The operations may include conveying the tool into a first wellbore formed in a first subsurface formation. The operations may include detecting, via the first receiver, a third measurement of a second signal transmitted by the transmitter into the first subsurface formation. The operations may include detecting, via the second receiver, a fourth measurement of the second signal. The operations may include determining, based on the third and fourth measurements, a second tensor including values depending on the first tilt angle, and the second tilt angle. The operations also may include determining a third tensor based on a relationship between the first tensor and the second tensor, wherein the third tensor includes values independent of the first tilt angle and the second tilt angle.

While the aspects of the disclosure are described with reference to various implementations and exploitations, it will be understood that these aspects are illustrative and that the scope of the claims is not limited to them. In general, techniques for reservoir modeling as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

EXAMPLE EMBODIMENTS

Embodiment #1: A method comprising: detecting, via a first receiver of a tool, a first measurement of a first signal transmitted by a transmitter of the tool into a substantially non-conductive material, wherein the first receiver is oriented at a first tilt angle and the transmitter is oriented at a second tilt angle; detecting, via a second receiver of the tool, a second measurement of the first signal; wherein the second receiver is oriented at a third tilt angle; determining, based on the first and second measurements, a first tensor including values depending on the first tilt angle, second tilt angle and the third tilt angle; conveying the tool into a first wellbore formed in a subsurface formation; detecting, via the first receiver, a third measurement of a second signal transmitted by the transmitter into the subsurface formation; detecting, via the second receiver, a fourth measurement of the second signal; determining, based on the third and fourth measurements, a second tensor including values depending on the first tilt angle, the second tilt angle and the third tilt angle; and determining a third tensor based on a relationship between the first tensor and the second tensor, wherein the third tensor includes values independent of the first tilt angle, the second tilt angle, and the third tilt angle.

Embodiment #2: The method of Embodiment #1 further comprising:
providing the third tensor as input to an inversion process.

Embodiment #3: The method of any one of Embodiments #1-2, further comprising: determining a tool response on the third tensor; determining a property of the subsurface formation based on the tool response.

Embodiment #4: The method of Embodiment #2, further comprising:
performing a downhole operation based on the inverted formation property.

Embodiment #5: The method of any one of Embodiments #1-4, wherein the tool has a cylindrical shape and the first tilt angle, the second tilt angle and the third tilt angle are measured relative to a longitudinal axis of the tool.

Embodiment #6: The method of any one of Embodiments #1-5, wherein the substantially non-conductive material is air.

Embodiment #7: The method of any one of Embodiments #1-6, wherein the third tilt angle is an additive inverse of the first tilt angle.

Embodiment #8: A non-transitory, computer-readable medium having instructions stored thereon that are executable by a processor to cause the processor to: receive a first measurement, detected by a first receiver of a tool, of a first signal transmitted by a transmitter of the tool into a substantially non-conductive material, wherein the first receiver is oriented at a first tilt angle and the transmitter is oriented at a second tilt angle; receive a second measurement of the first signal that is detected by a second receiver of the tool, wherein the second receiver is oriented at a third tilt angle; determine, based on the first and second measurements, a first tensor including values depending on the first tilt angle and the second tilt angle; receive a third measurement of a second signal, detected by the first receiver and transmitted by the transmitter into a subsurface formation after the tool is conveyed into a first wellbore formed in the subsurface formation; receive a fourth measurement, detected by the second receiver, of the second signal; determine, based on the third and fourth measurements, a second tensor including values depending on the first tilt angle, and the second tilt angle; and determine a third tensor based on a relationship between the first tensor and the second tensor, wherein the third tensor includes values independent of the first tilt angle and the second tilt angle.

Embodiment #9: The non-transitory, computer-readable medium of Embodiment #8, wherein the instructions comprise instructions executable by the processor to cause the processor to provide the third tensor as input to an inversion process.

Embodiment #10: The non-transitory, computer-readable medium of any one of Embodiments #8-9, wherein the instructions comprise instructions executable by the processor to cause the processor to determine a tool response based on the third tensor; and determine a property of the subsurface formation based on the tool response.

Embodiment #11: The non-transitory, computer-readable medium of any one of Embodiments #8-10, wherein the instructions comprise instructions executable by the processor to cause the processor to: perform a downhole operation based on the inverted formation property.

Embodiment #12: The non-transitory, computer-readable medium of any one of Embodiments #8-11, wherein the tool has a cylindrical shape and the first tilt angle and the second tilt angle are measured relative to a longitudinal axis of the tool.

Embodiment #13: The non-transitory, computer-readable medium of any one of Embodiments #8-12, wherein the substantially non-conductive material is air.

Embodiment #14: The non-transitory, computer-readable medium of any one of Embodiments #8-13, wherein the third tilt angle is an additive inverse of the first tilt angle.

Embodiment #15: A system comprising: a downhole tool comprising, a transmitter to transmit a first signal into a substantially non-conductive material; a first receiver oriented at a first tilt angle, wherein the transmitter is oriented at a second tilt angle, wherein the first receiver is to detect a first measurement of the first signal; and a second receiver to detect a second measurement of the first signal, wherein a second receiver oriented at a third tilt angle; a processor; and a machine-readable medium having instructions stored thereon that are executable by the processor to cause the processor to, determine, based on the first and second measurements, a first tensor including values depending on the first tilt angle and the second tilt angle, wherein the downhole tool is to be conveyed into a first wellbore formed in a subsurface formation, wherein the transmitter is to transmit a second signal into the subsurface formation, the first receiver to detect a third measurement of the second signal and the second receiver to detect a fourth measurement of the second signal; determine, based on the third and fourth measurements, a second tensor including values depending on the first tilt angle and the second tilt angle; and determine a third tensor based on a relationship between the first tensor and the second tensor, wherein the third tensor includes values independent of the first tilt angle and the second tilt angle.

Embodiment #16: The system of Embodiment #15, wherein the instructions comprise instructions executable by the processor to cause the processor to provide the third tensor as input to an inversion process.

Embodiment #17: The system of any one of Embodiments #15-16, wherein the instructions comprise instructions executable by the processor to cause the processor to determine a tool response based on the third tensor; and determine a property of the subsurface formation based on the tool response.

Embodiment #18: The system of any one of Embodiments #15-17, wherein the instructions comprise instructions executable by the processor to cause the processor to perform a downhole operation based on the inverted formation property.

Embodiment #19: The system of any one of Embodiments #15-18, wherein the downhole tool has a cylindrical shape and the first tilt angle and the second tilt angle are measured relative to a longitudinal axis of the downhole tool.

Embodiment #20: The system of any one of Embodiments #15-19, wherein the substantially non-conductive material is air.

As used herein, the term "or" is inclusive unless otherwise explicitly noted. Thus, the phrase "at least one of A, B, or C" is satisfied by any element from the set {A, B, C} or any combination thereof, including multiples of any element.

What is claimed is:

1. A method comprising:
    detecting, via a first receiver of a tool, a first measurement of a first signal transmitted by a transmitter of the tool into a substantially non-conductive material, wherein the first receiver is oriented at a first tilt angle and the transmitter is oriented at a second tilt angle;
    detecting, via a second receiver of the tool, a second measurement of the first signal; wherein the second receiver is oriented at a third tilt angle;
    determining, based on the first and second measurements, a first tensor including values depending on the first tilt angle, second tilt angle and the third tilt angle;
    conveying the tool into a first wellbore formed in a subsurface formation;
    detecting, via the first receiver, a third measurement of a second signal transmitted by the transmitter into the subsurface formation;
    detecting, via the second receiver, a fourth measurement of the second signal;
    determining, based on the third and fourth measurements, a second tensor including values depending on the first tilt angle, the second tilt angle and the third tilt angle; and
    determining a third tensor based on a relationship between the first tensor and the second tensor, wherein the third tensor includes values independent of the first tilt angle, the second tilt angle, and the third tilt angle.

2. The method of claim 1 further comprising:
providing the third tensor as input to an inversion process.

3. The method of claim 1 further comprising:
determining a tool response on the third tensor;
determining a property of the subsurface formation based on the tool response.

4. The method of claim 2, further comprising:
performing a downhole operation based on the inverted formation property.

5. The method of claim 1, wherein the tool has a cylindrical shape and the first tilt angle, the second tilt angle and the third tilt angle are measured relative to a longitudinal axis of the tool.

6. The method of claim 1, wherein the substantially non-conductive material is air.

7. The method of claim 1, wherein the third tilt angle is an additive inverse of the first tilt angle.

8. A non-transitory, computer-readable medium having instructions stored thereon that are executable by a processor to cause the processor to:
receive a first measurement, detected by a first receiver of a tool, of a first signal transmitted by a transmitter of the tool into a substantially non-conductive material, wherein the first receiver is oriented at a first tilt angle and the transmitter is oriented at a second tilt angle;
receive a second measurement of the first signal that is detected by a second receiver of the tool, wherein the second receiver is oriented at a third tilt angle;
determine, based on the first and second measurements, a first tensor including values depending on the first tilt angle and the second tilt angle;
receive a third measurement of a second signal, detected by the first receiver and transmitted by the transmitter into a subsurface formation after the tool is conveyed into a first wellbore formed in the subsurface formation;
receive a fourth measurement, detected by the second receiver, of the second signal;
determine, based on the third and fourth measurements, a second tensor including values depending on the first tilt angle, and the second tilt angle; and
determine a third tensor based on a relationship between the first tensor and the second tensor, wherein the third tensor includes values independent of the first tilt angle and the second tilt angle.

9. The non-transitory, computer-readable medium of claim 8, wherein the instructions comprise instructions executable by the processor to cause the processor to,
provide the third tensor as input to an inversion process.

10. The non-transitory, computer-readable medium of claim 8, wherein the instructions comprise instructions executable by the processor to cause the processor to,
determine a tool response based on the third tensor; and
determine a property of the subsurface formation based on the tool response.

11. The non-transitory, computer-readable medium of claim 8, wherein the instructions comprise instructions executable by the processor to cause the processor to:
perform a downhole operation based on the inverted formation property.

12. The non-transitory, computer-readable medium of claim 8, wherein the tool has a cylindrical shape and the first tilt angle and the second tilt angle are measured relative to a longitudinal axis of the tool.

13. The non-transitory, computer-readable medium of claim 8, wherein the substantially non-conductive material is air.

14. The non-transitory, computer-readable medium of claim 8, wherein the third tilt angle is an additive inverse of the first tilt angle.

15. A system comprising:
a downhole tool comprising,
a transmitter to transmit a first signal into a substantially non-conductive material;
a first receiver oriented at a first tilt angle, wherein the transmitter is oriented at a second tilt angle, wherein the first receiver is to detect a first measurement of the first signal; and
a second receiver to detect a second measurement of the first signal, wherein the second receiver is oriented at a third tilt angle;
a processor; and
a machine-readable medium having instructions stored thereon that are
executable by the processor to cause the processor to,
determine, based on the first and second measurements, a first tensor including values depending on the first tilt angle and the second tilt angle,
wherein the downhole tool is to be conveyed into a first wellbore formed in a subsurface formation, wherein the transmitter is to transmit a second signal into the subsurface formation, the first receiver to detect a third measurement of the second signal and the second receiver to detect a fourth measurement of the second signal;
determine, based on the third and fourth measurements, a second tensor including values depending on the first tilt angle and the second tilt angle; and
determine a third tensor based on a relationship between the first tensor and the second tensor, wherein the third tensor includes values independent of the first tilt angle and the second tilt angle.

16. The system of claim 15, wherein the instructions comprise instructions executable by the processor to cause the processor to,
provide the third tensor as input to an inversion process.

17. The system of claim 15, wherein the instructions comprise instructions executable by the processor to cause the processor to,
determine a tool response based on the third tensor; and
determine a property of the subsurface formation based on the tool response.

18. The system of claim 15, wherein the instructions comprise instructions executable by the processor to cause the processor to,
perform a downhole operation based on the inverted formation property.

19. The system of claim 15, wherein the downhole tool has a cylindrical shape and the first tilt angle and the second tilt angle are measured relative to a longitudinal axis of the downhole tool.

20. The system of claim 15, wherein the substantially non-conductive material is air.

* * * * *